United States Patent
Frulio et al.

(10) Patent No.: US 7,269,058 B2
(45) Date of Patent: Sep. 11, 2007

(54) SYSTEM AND METHOD FOR PRESERVING AN ERROR MARGIN FOR A NON-VOLATILE MEMORY

(75) Inventors: Massimiliano Frulio, Milan (IT); Fabio Tassan Caser, Arcore Milano (IT); Lorenzo Bedarida, Milan (IT); Mirella Marsella, Taranto (IT)

(73) Assignee: Atmel Corporation, San Jose, CA (US)

( * ) Notice: Subject to any disclaimer, the term of this patent is extended or adjusted under 35 U.S.C. 154(b) by 158 days.

(21) Appl. No.: 11/124,939

(22) Filed: May 9, 2005

(65) Prior Publication Data
US 2006/0044885 A1   Mar. 2, 2006

(30) Foreign Application Priority Data
Aug. 26, 2004   (IT) ................... MI2004A1671

(51) Int. Cl.
  *G11C 11/00*   (2006.01)
(52) U.S. Cl. .............. 365/156; 365/185.21; 365/189.09
(58) Field of Classification Search ........... 365/185.21, 365/189.09, 156
See application file for complete search history.

(56) References Cited

U.S. PATENT DOCUMENTS

| | | | |
|---|---|---|---|
| 4,524,412 A | 6/1985 | Eng | |
| 5,157,269 A | 10/1992 | Jordan et al. | |
| 5,341,108 A | 8/1994 | Willocx et al. | |
| 6,373,304 B1 | 4/2002 | Drost et al. | |
| 6,717,856 B2* | 4/2004 | Srinivasan et al. | .... 365/185.21 |
| 2004/0017249 A1 | 1/2004 | Engl | |

* cited by examiner

*Primary Examiner*—Son Dinh
*Assistant Examiner*—Pho M. Luu
(74) *Attorney, Agent, or Firm*—Sawyer Law Group LLP

(57) ABSTRACT

A system and method for preserving an error margin for a non-volatile memory that includes a memory cell, a reference cell coupled to a reference current mirror configured to mirror current through the reference cell. The system comprises a memory current mirror coupled to the memory cell and configured to mirror current through the memory cell. A sense amplifier has a first and a second input. The first input is coupled to the reference current mirror and the second input is coupled to the memory current mirror. The sense amplifier is configured to compare a voltage across the memory cell with a voltage across the reference cell.

17 Claims, 2 Drawing Sheets

SYSTEM AND METHOD FOR PRESERVING AN ERROR MARGIN FOR A NON-VOLATILE MEMORY

CROSS-REFERENCE TO RELATED APPLICATIONS

This application claims benefit under 35 USC 119 of Italian Application no. MI2004A 001671, filed on Aug. 26, 2004.

FIELD OF THE INVENTION

The present invention relates to non-volatile memory, and more particularly to preserving an error margin for a non-volatile memory.

BACKGROUND OF THE INVENTION

Non-volatile memory is a type of memory that preserves data with or without power applied to the memory. Most computer and electronic systems use a binary number system with bits. Two distinctly different current levels that flow through the memory under the correct conditions represent each bit, a one or a zero.

Some memory is single-level, where one bit of information is stored in each memory cell. In order to determine the value of the memory cell, current through the memory cell is compared to a reference memory cell. A current through the memory cell that is higher than that through the reference cell represents a bit value (e.g. one), while a current through the memory cell that is lower than that through the reference cell represents the other bit value (e.g. zero).

FIG. 1 is a schematic diagram illustrating a conventional memory system 10. The system 10 includes memory cell 12, which stores data. In order to read the data out, current through memory cell 12 is compared with current though reference memory cell 14. Whether the current through memory cell 12 is higher or lower than current through reference memory cell 14 determines the bit value stored in memory cell 12.

During a read sequence, for example, of system 10, reference memory cell 14 is biased to an appropriate voltage level by transistor 16, causing current "I" to travel through transistor 16 and cell 14. Transistor 18 and transistor 20 are in a current mirror configuration, whereby current passing through transistor 18 is "mirrored" with current passing through transistor 20. The amount of current through transistor 20 is relative to the amount of current through transistor 18 in approximately the same ratio as the gate width of transistor 20 to the gate width of transistor 18. A wider gate in transistor 20 will result in more current passing through transistor 20 than transistor 18. In one example, transistor 20 has a gate that is "n" times larger than the gate of transistor 18, therefore the current drawn through transistor 20 is "nI." This may be done in order to more rapidly charge capacitor 21.

Memory cell system 22 is one of many cells (not shown) connected to reference memory cell 14. Each of cell systems 22 includes a memory cell. In order to compare current through reference memory cell 14, transistors 24 and 26 form another current mirror, with current passing through transistor 24 mirrored by current drawn through transistor 26. Capacitor 21 biases transistor 26, causing a current "I," which is close to the same current level "I" through transistor 14.

Transistors 28 and 30 form another current mirror, however current "I" is not mirrored through memory cell 12. Rather, transistor 32 biases transistor 12 and in conjunction with load 34 creates a current "I*" that is relative to the value stored in memory cell 12.

Sense amplifier 36 compares the voltage at point 38 with the voltage at point 40 and based on that comparison, the bit value stored in memory cell 12 may be determined.

One problem with the conventional system 10 is that the current mirrors created by transistors 18 and 20, and 24 and 26 introduce error currents (Early effect) because there is a voltage mismatch between the transistors in the mirror. In other words, the current mirror does not mirror current perfectly from one side to the other. Sense amplifier 36 compares voltage at point 40 to voltage at point 38, including the errors produced in current by the current mirrors. Rather than comparing voltage across memory cell 12 with the actual voltage across reference memory cell 14, there is an error imparted by the current mirrors. The margin for error in determining a bit value from memory cell 12 is decreased when error is introduced into system 10 through the current mirrors.

Therefore, in a single-level memory there is some decrease in the margin for error. However, some memory is multi-level, having more than one bit in each memory cell. Multiple bits require multiple levels of current to represent the bits, further reducing the margin for error in reading memory cells. The margin for error is more limited in multi-level memory than in single-level memory.

Accordingly, what is needed is a system and method for preserving the margin for error in memory. The present invention addresses such a need.

SUMMARY OF THE INVENTION

A system and method for preserving an error margin for a non-volatile memory that includes a memory cell, a reference cell coupled to a reference current mirror configured to mirror current through the reference cell. The system comprises a memory current mirror coupled to the memory cell and configured to mirror current through the memory cell. A sense amplifier has a first and a second input. The first input is coupled to the reference current mirror and the second input is coupled to the memory current mirror. The sense amplifier is configured to compare a voltage representing the memory cell content with a voltage representing the reference cell content.

According to the method and system disclosed herein, the present invention preserves the margin for error by relocating the sense amplifier such that error introduced on the reference cell side of the circuit is duplicated on the memory cell side of the circuit, with the same number of and configuration of current mirrors, or their equivalents. In this manner, the errors in current caused by the Early effect on one side are cancelled out, or matched, by the same errors on the other side. This simplifies the design and avoids an extra device for controlling the Early effect.

DETAILED DESCRIPTION OF THE INVENTION

The present invention relates to non-volatile memory, and more particularly to preserving an error margin for a non-volatile memory. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
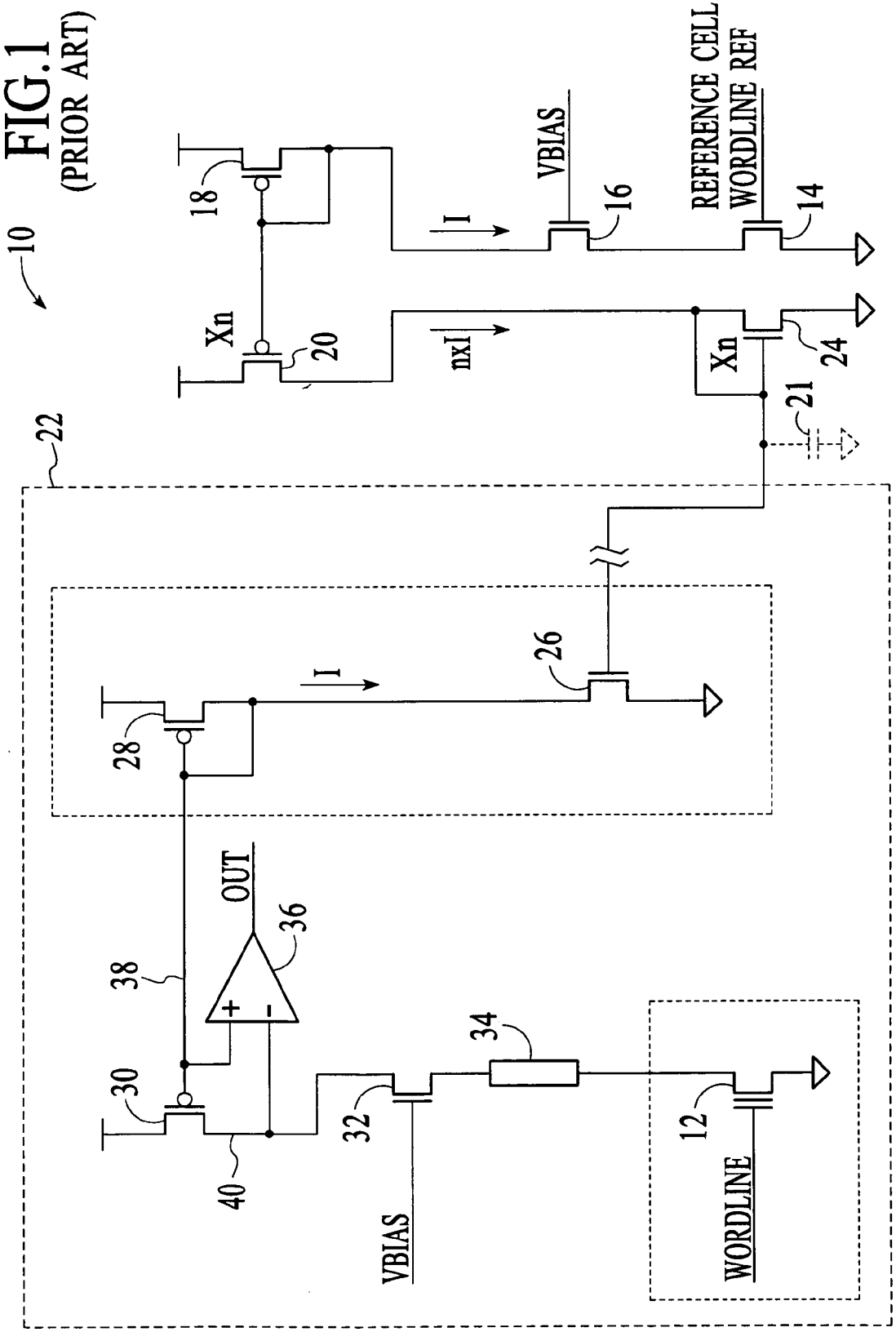
FIG. 1 is a schematic diagram illustrating a conventional memory and reference cell routing system.
Figure 2:
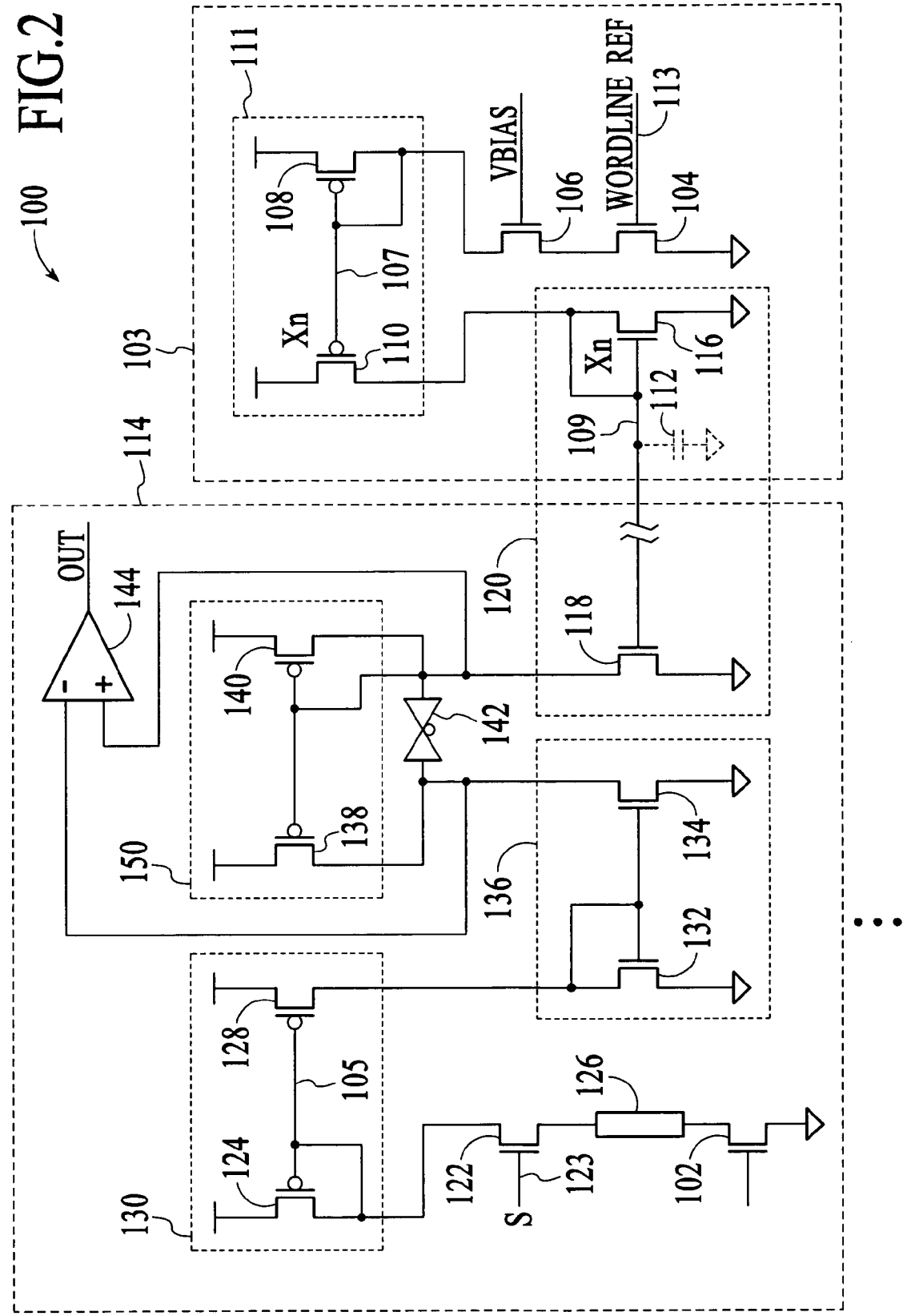
FIG. 2 is a schematic diagram illustrating one embodiment of the invention in a memory and reference cell routing system.

FIG. 2 is a schematic diagram illustrating system 100 in accordance with the present invention. System 100 includes reference cell system 103 and memory cell system 114. Memory cell system 114 includes memory cell 102, which stores data. Reference cell system includes reference (memory) cell 104, which is used in determining the value of data in memory cell 102. In order to read data out of memory cell 102, current through memory cell 102 is compared with current through reference cell 104. Whether the current through memory cell 102 is higher or lower than current through reference cell 104 (for a given bit) determines the bit value stored in memory cell 102.

Current through memory cell system 114 is directed by current mirror path 105, while current through reference cell system 103 is directed by current mirror path 107. Current between reference cell system 103 and memory cell system 114 is directed by current mirror path 109. Error is introduced into the current in reference cell system 103 by current mirror path 107. Current mirror path 105, in memory cell system 114, balances error in the current through reference cell system 103 by introducing approximately the same error. By comparing two currents with approximately the same introduced error, the error margin in a memory cell is preserved.

System 100 may be implemented in a non-volatile memory, for example. A typical non-volatile memory has multiple memory cell systems 114, which are not illustrated for simplicity.

In a memory read operation, for example, reference cell 104 is biased to an appropriate voltage level by transistor 106 and wordline reference 113, causing current to travel through transistor 106 and reference cell 104. Transistor 108 and transistor 110 make up reference current mirror 111, whereby current passing through transistor 108 is "mirrored" with current passing through transistor 110. Reference current mirror 111 is part of current mirror path 107. In one example, transistor 110 has a gate that is "n" times larger than the gate of transistor 108, therefore the current drawn through transistor 20 is n times the current through transistor 18. This may be done in order to more rapidly charge capacitor 112. In one example, transistors 110 and 108 are pmos transistors.

Memory cell circuit 114 is one of many cells (not shown) connected to reference cell 104. Each of memory cell circuits 114 includes one or more (not shown) memory cells 102. Transistors 116 and 118 form reference current mirror 120, with current passing through transistor 116 mirrored by current drawn through transistor 118. Reference current mirror 120 is part of current mirror path 107. Part of reference current mirror 120 is in memory cell circuit 114 while the other part of reference current mirror 120 is in reference cell circuit 103. In one example, transistors 116 and 118 are nmos transistors.

In memory cell circuit 114, memory cell 102 is biased by transistor 122 and wordline reference 123. A current flows through memory 102, transistors 122 and 124, and load 126. Transistors 124 and 128 form memory current mirror 130, which mirrors the current (or some set ratio or it) through memory cell 102. Memory current mirror 130 is part of current mirror path 105. The mirrored current from memory current mirror 130 passes through transistor 128. In one example, transistors 124 and 128 are pmos transistors. In accordance with the invention, memory current mirror 130 has a similar error effect on current as reference current mirror 111. The error introduced by reference current mirror 111 is therefore balanced by error introduced by memory current mirror 130. Load 126 may be a parasitic capacitance, for example.

Transistor 132 passes current from transistor 128 and forms memory current mirror 136 with transistor 134. Memory current mirror 136 is part of current mirror path 105. In one example, transistors 132 and 134 are nmos transistors. In accordance with the invention, memory current mirror 136 has a similar error effect on current as reference current mirror 120. The error introduced by reference current mirror 120 is therefore balanced with error introduced by memory current mirror 136.

Within memory cell circuit 114, transistors 138 and 140 connect to transistors 134 and 118, respectively. Transistors 138 and 140 are put in diode configuration by passgate 142 during a pre-charge phase of the read operation, and therefore supply current being reflected in each of current mirrors 136 and 120. Sense amplifier 144 is connected to transistors 134 and 118 such that sense amplifier 144 can compare the voltage across transistor 134 with the voltage across transistor 118. Because the voltage across transistors 134 and 118 is indicative of the current through them, a determination may be made about what bit value is stored in memory cell 102 based on its current relative to reference cell 104.

The reference cell current is mirrored through current mirror path 107, including reference current mirrors 111, 120, and 150, producing a cumulative error current. The cumulative error current is made negligible with passgate 142 during the beginning (pre-charge phase) of the read operation. The memory cell current is mirrored through current mirror path 105, including memory current mirrors 130 and 136. The error produced by memory current mirror 130 balances the error produced by reference current mirror 111, while the error produced by memory current mirror 136 balances the error produced by reference current mirror 120. Therefore, the global error has been compensated. The invention provides a more accurate current comparison than in conventional systems even if the power supply and threshold voltages are not controlled well. This simplifies the design and avoids an extra device for controlling the Early effect.

The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A system for preserving an error margin for a non-volatile memory comprising:
    a memory cell;
    a memory current mirror coupled to the memory cell and configured to mirror current through the memory cell, the memory current mirror comprising a plurality of memory current mirrors;
    a reference cell;
    a reference current mirror coupled to the reference cell and configured to mirror current through the reference cell; and
    a sense amplifier having a first and a second input, the first input coupled to the reference current mirror and the second input coupled to the memory current mirror, the sense amplifier configured to compare a voltage across the memory cell with a voltage across the reference cell.

2. The system of claim 1, the reference current mirror further comprising a plurality of reference current mirrors.

3. The system of claim 2 wherein the plurality of memory current mirrors are further configured to generate an error current of approximately the same magnitude as an error current generated by the plurality of reference current mirrors.

4. A system for preserving an error margin for a non-volatile memory comprising:
    a memory cell;
    a memory current mirror coupled to the memory cell and configured to mirror current through the memory cell;
    a reference cell;
    a reference current mirror coupled to the reference cell and configured to mirror current through the reference cell;
    a sense amplifier having a first and a second input, the first input coupled to the reference current mirror and the second input coupled to the memory current mirror, the sense amplifier configured to compare a voltage across the memory cell with a voltage across the reference cell;
    a pair of transistors coupled to the reference current mirror and the memory current mirror; and
    a pass gate coupled to the pair of transistors and configured to bias the pair of transistors in a diode configuration.

5. A method for preserving an error margin for a non-volatile memory having a memory cell, a reference cell coupled to a reference current mirror configured to mirror current through the reference cell, the method comprising:
    passing current through a memory current mirror coupled to the memory cell and configured to mirror current through the memory cell and to approximate the effect on current through the reference current mirror; and
    comparing the voltage across the memory cell to the voltage across the reference cell using a sense amplifier.

6. The method of claim 5, the memory current mirror further comprising a plurality of memory current mirrors.

7. The method of claim 6, the reference current mirror further comprising a plurality of reference current mirrors.

8. The method of claim 7 further comprising:
    generating approximately the same error current in the plurality of memory current mirrors as in the plurality of reference current mirrors.

9. The method of claim 5 further comprising:
    passing current through a first transistor coupled to the memory current mirror; and
    passing current through a second transistor coupled to the reference current mirror.

10. The method of claim 9 further comprising:
    biasing the first and second transistors in diode configuration with a pass gate coupled to the first and second transistors.

11. A non-volatile memory comprising:
    a reference cell system including a first current mirror path; and
    at least one memory cell system coupled to the reference cell system, the at least one memory cell system including a second current mirror path, wherein a current error introduced by the first current mirror path is balanced by the second current mirror path.

12. The non-volatile memory of claim 11, the memory cell system further comprising:
    a memory cell coupled to the second current mirror path; and
    a sense amplifier coupled to the second current mirror path and the reference cell system and configured to compare a voltage across the memory cell with a voltage in the reference cell system.

13. The non-volatile memory of claim 12, the memory cell system further comprising:
    a pair of transistors coupled to the sense amplifier and the second current mirror path.

14. The non-volatile memory of claim 13, the memory cell system further comprising:
    a pass gate coupled to the pair of transistors and configured to bias the pair of transistors in a diode configuration.

15. The non-volatile memory of claim 14, the reference cell system further comprising:
    a reference cell coupled to the first current mirror path.

16. The non-volatile memory of claim 11 further comprising:
    a third current mirror path coupled between the reference cell system and the memory cell system, wherein a current error introduced by the first current mirror path and the third current mirror path is balanced by the second current mirror path.

17. The non-volatile memory of claim 11 further comprising:
    a plurality of memory cell systems coupled to the reference cell system.

* * * * *